(12) United States Patent
Brush, IV et al.

(10) Patent No.: US 9,423,422 B2
(45) Date of Patent: Aug. 23, 2016

(54) OSCILLOSCOPE PROBE HAVING OUTPUT CLAMPING CIRCUIT

(71) Applicant: Keysight Technologies, Inc., Minneapolis, MN (US)

(72) Inventors: Edward Vernon Brush, IV, Colorado Springs, CO (US); Michael T. McTigue, Colorado Springs, CO (US); Kenneth W. Johnson, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 234 days.

(21) Appl. No.: 13/869,774

(22) Filed: Apr. 24, 2013

(65) Prior Publication Data

US 2014/0320157 A1      Oct. 30, 2014

(51) Int. Cl.
*G01R 31/20* (2006.01)
*G01R 1/067* (2006.01)
*G01R 1/20* (2006.01)
*H03K 5/08* (2006.01)

(52) U.S. Cl.
CPC .............. *G01R 1/06766* (2013.01); *G01R 1/20* (2013.01); *G01R 1/06788* (2013.01); *H03K 5/08* (2013.01)

(58) Field of Classification Search
CPC ...... H03K 5/08; G01R 1/06766; G01R 1/20; G01R 1/06788; H01L 2924/00; H01L 2924/00014; H01L 2924/0002; H01L 2224/05599
USPC ......... 324/71, 378, 403, 415, 425, 500, 537, 324/754, 754.01
See application file for complete search history.

(56) References Cited

U.S. PATENT DOCUMENTS

| 4,704,575 | A | * | 11/1987 | Arnoux et al. ............ 324/117 H |
| 5,696,773 | A | * | 12/1997 | Miller .............. G01R 31/31924 327/334 |
| 6,225,972 | B1 | | 5/2001 | Taraki et al. |
| 7,116,120 | B1 | * | 10/2006 | Cannon ................ G01R 1/0408 324/756.04 |
| 7,139,669 | B2 | * | 11/2006 | Tallman ............... G01R 13/029 702/66 |
| 7,162,375 | B2 | | 1/2007 | Van Epps et al. |
| 7,626,456 | B2 | * | 12/2009 | Calo ..................... H03F 1/3211 330/207 P |
| 7,733,105 | B2 | | 6/2010 | Nozaki et al. |
| 8,648,629 | B2 | * | 2/2014 | Rossi ............... H03K 19/01852 327/108 |

(Continued)

FOREIGN PATENT DOCUMENTS

WO       2011135094 A1    11/2011

OTHER PUBLICATIONS

Circuits Today; "Diode Clamping Circuit"; http://www.circuitstoday.com/diode-clamping-circuits; Mar. 28, 2011.*

(Continued)

*Primary Examiner* — Huy Q Phan
*Assistant Examiner* — Raul Rios Russo

(57) ABSTRACT

A probe for a measurement instrument comprises an input terminal configured to receive an input signal from a device under test (DUT), an output terminal configured to transmit an output signal to a measurement instrument, and a clamping circuit disposed in a signal path between the input terminal and the output terminal and configured to clamp an internal probe signal between an upper clamping threshold and a lower clamping threshold to produce the output signal, wherein the clamping circuit operates with substantial gain and amplitude linearity throughout a range between the upper clamping threshold and the lower clamping threshold.

20 Claims, 13 Drawing Sheets

(56) References Cited

U.S. PATENT DOCUMENTS

| | | | | |
|---|---|---|---|---|
| 2004/0227556 | A1* | 11/2004 | Ohmori | H03K 19/00315 327/309 |
| 2005/0208911 | A1* | 9/2005 | Petersen | 455/127.5 |
| 2007/0115022 | A1* | 5/2007 | Hemminger | G01R 21/133 363/56.11 |
| 2008/0090545 | A1* | 4/2008 | Tokairin et al. | 455/343.1 |
| 2008/0309355 | A1* | 12/2008 | Nozaki et al. | 324/754 |
| 2009/0086395 | A1* | 4/2009 | Skrenes | H03K 5/08 361/91.2 |
| 2012/0268092 | A1* | 10/2012 | Rossi | H03K 19/018521 323/282 |
| 2012/0268200 | A1* | 10/2012 | Rossi | H03K 19/018521 327/574 |
| 2013/0049783 | A1 | 2/2013 | Driesen et al. | |
| 2014/0320145 | A1 | 10/2014 | Johnson et al. | |
| 2014/0320157 | A1 | 10/2014 | Brush, IV et al. | |
| 2015/0002136 | A1 | 1/2015 | McTigue et al. | |

OTHER PUBLICATIONS

Michael Lemmon; "What is a clamp circuit?" http://www3.nd.edu/~lemmon/courses/ee224/web-manual/web-manual/lab5/node9.html; Feb. 1, 2009.*

* cited by examiner

OSCILLOSCOPE PROBE HAVING OUTPUT CLAMPING CIRCUIT

BACKGROUND

An oscilloscope is a type of electronic test instrument that allows observation of time-varying electrical signals. During typical operation, an oscilloscope receives an input signal through an oscilloscope probe connected to a device under test (DUT) and displays the received signal on an electronic display.

In certain contexts, it may be desirable to use an oscilloscope to observe signals over a large range of values, i.e., over a high dynamic range. For instance, when characterizing a mobile phone, it may be desirable to observe its signal characteristics when operating at a low current state, such as a sleep state, and when operating at a high current state, e.g., a signal transmission state. Moreover, it may also be desirable to observe signals at varying levels of scope or resolution, e.g., at a zoomed-in level and a zoomed-out level.

When using an oscilloscope to observe signals over a high dynamic range, it is not uncommon for the signals to exceed the normal operating range of various oscilloscope components, such as its input amplifier and/or analog to digital converter (ADC). As an example, when performing signal integrity measurements (e.g., overshoot, undershoot, ripple), a user may want to measure small aberrations on the top and bottom of the signals. To observe these aberrations, the user may increase the effective resolution and accuracy of the oscilloscope display by offsetting the input signal and then increasing the vertical sensitivity around a waveform portion of interest. This will spread out the small aberrations of the signal over a larger range of the oscilloscope's ADC. This technique will generally improve the resolution of the measurement on the aberrations, but it may also drive major portions of the signal off-screen and beyond the dynamic range of the oscilloscope's input amplifier and ADC.

Where an input signal exceeds the dynamic range of the above or other components, it may saturate the output of those components or engage overdrive protection circuitry until the input signal returns to within the dynamic range. Thereafter, the oscilloscope probe output may exhibit distortion during a period of "overdrive recovery" in which the components return to normal operation. For instance, if an input signal saturates the input amplifier and then subsequently returns to within the amplifier's linear operating range, the amplifier's output may exhibit nonlinear distortions during a period after the input signal returns to the linear operating range.

Due to these distortions and other factors, it is generally undesirable to allow oscilloscope input signals to exceed the oscilloscope's dynamic range. Conventionally, if an oscilloscope probe's output exceeds the oscilloscope's dynamic range, the recommended solution is to increase the volts per division (V/div) of a corresponding oscilloscope channel until the full screen voltage is greater than the output voltage. However, increasing the V/div of an oscilloscope channel increases channel noise and reduces ADC resolution, thus hindering the ability to discern small signals. For oscilloscope probes with large dynamic range outputs, the overdrive recovery of the oscilloscope input does not allow the signal to be viewed accurately at maximum sensitivities. Large signals cannot be observed at sub-millivolt accuracies due to channel input noise and lack of ADC resolution.

In view of the above and other shortcomings of conventional approaches, there is a general need for techniques and technologies to accurately view small voltages in a large dynamic range probe output.

SUMMARY

In a representative embodiment, a probe for a measurement instrument comprises an input terminal configured to receive an input signal from a DUT, an output terminal configured to transmit an output signal to a measurement instrument, and a clamping circuit disposed in a signal path between the input terminal and the output terminal and configured to clamp an internal probe signal between an upper clamping threshold and a lower clamping threshold to produce the output signal, wherein the clamping circuit operates with substantial gain and amplitude linearity throughout a range between the upper clamping threshold and the lower clamping threshold. In certain related embodiments, the clamping circuit comprises a first precision rectifier configured to clamp a positive voltage portion of the internal probe signal to produce a first intermediate signal, a first level shifter configured to adjust a DC bias of the first intermediate signal to produce a second intermediate signal, a second precision rectifier configured to clamp a negative voltage portion of the internal probe signal to produce a third intermediate signal, and a second level shifter configured to adjust a DC bias of the third intermediate signal to produce the analog output signal. In certain other related embodiments, the probe further comprises an additional output terminal configured to transmit an additional output signal to the measurement instrument, a first probe amplifier disposed in the signal path between the input terminal and the output terminal and located between the input terminal and the clamping circuit, and a second probe amplifier disposed in an additional signal path between the input terminal and the additional output terminal.

In another representative embodiment, a measurement system comprises a measurement instrument comprising an overdrive protection circuit having respective upper and lower overdrive protection thresholds, and a measurement probe comprising an input terminal configured to receive an input signal from a DUT, an output terminal configured to transmit an output signal to the measurement instrument, and a clamping circuit disposed in a signal path between the input terminal and the output terminal and configured to clamp an internal probe signal between an upper clamping threshold and a lower clamping threshold to produce the output signal, wherein the upper overdrive protection threshold is greater than or equal to the upper clamping threshold and the lower overdrive protection threshold is less than or equal to the lower clamping threshold.

In yet another representative embodiment, a method of operating a measurement probe comprises receiving an input signal from a DUT, processing the input signal to produce an output signal, and transmitting the output signal to a measurement instrument, wherein processing the input signal comprises clamping the input signal between an upper clamping threshold and a lower clamping threshold to produce the output signal by operating a clamping circuit having substantial gain and amplitude linearity throughout a range between the upper clamping threshold and the lower clamping threshold. In certain related embodiments, the clamping comprises inverting the input signal and shifting a direct current (DC) bias of the input signal, clamping a negative portion of the inverted and shifted input signal to produce a first intermediate signal, inverting the first intermediate signal and shifting a DC bias of the inverted first intermediate signal to produce a second intermediate signal, inverting the second intermediate signal and shifting a DC bias of the second intermediate signal, clamping a positive portion of the inverted and shifted second intermediate signal to produce a third intermediate signal, and inverting the third intermediate signal and shifting a DC bias of the inverted third intermediate signal.

BRIEF DESCRIPTION OF THE DRAWINGS

The described embodiments are best understood from the following detailed description when read with the accompanying drawing figures. Wherever applicable and practical, like reference numerals refer to like elements.

DETAILED DESCRIPTION

Figure 1:
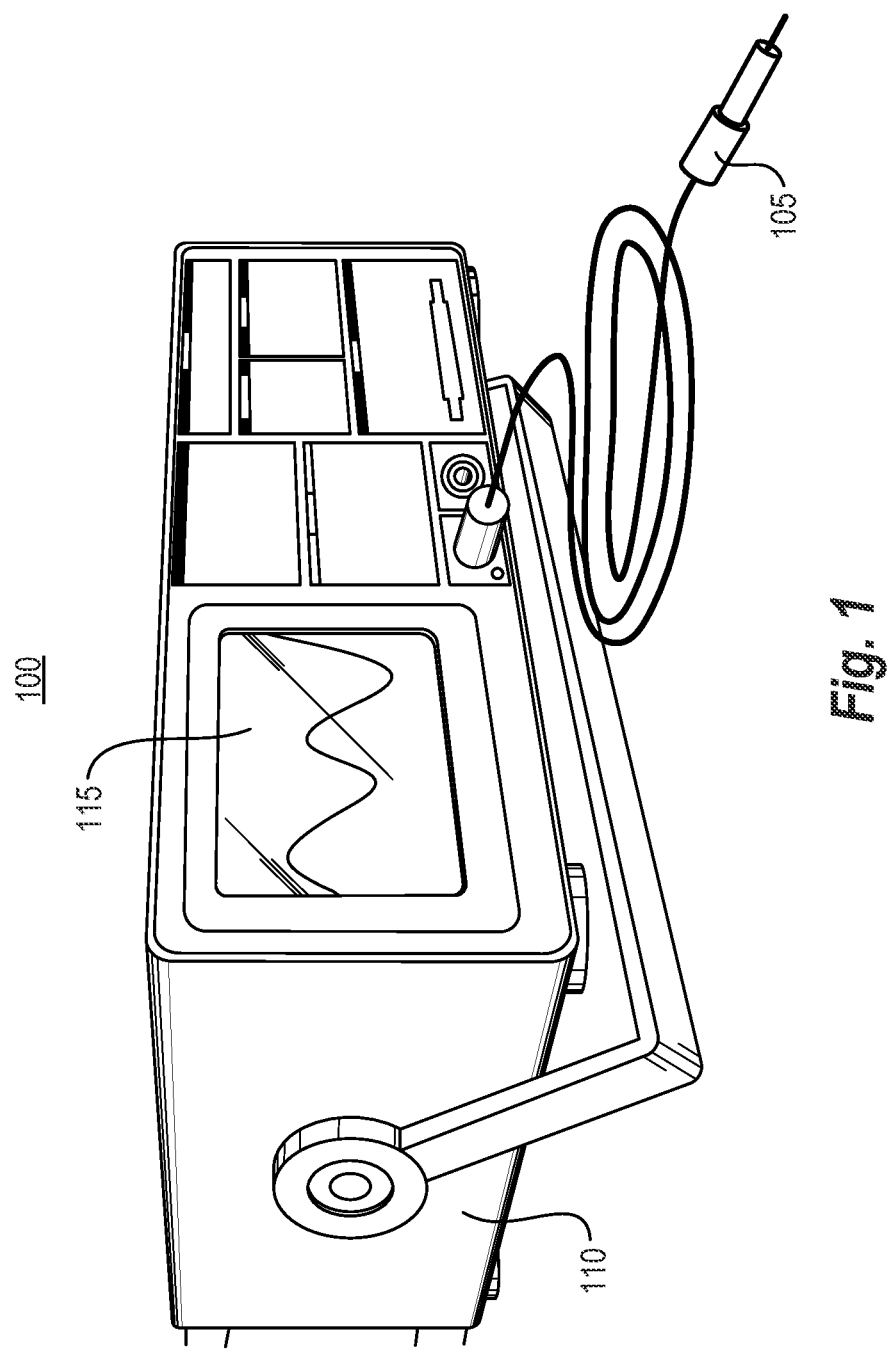
FIG. 1 is a schematic diagram of an oscilloscope and oscilloscope probe according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

The described embodiments relate generally to an oscilloscope probe comprising an output clamping circuit. The output clamping circuit is designed to prevent the oscilloscope probe from outputting signals that may saturate components of an oscilloscope or activate overdrive protection circuitry within an oscilloscope. The output clamping circuit maintains gain and amplitude linearity throughout a range of values bounded by predetermined upper and lower clamping thresholds. Accordingly, it allows signals to be observed with relative accuracy throughout that range, e.g., without distortion or other forms of noise that may otherwise be produced by saturated components or overdrive protection circuitry. This, in turn, may allow the oscilloscope to be used to measure small signals at relatively high sensitivity.

In certain embodiments, the output clamping circuit comprises a sequence of sub-circuits comprising a first precision rectifier, a first level shifter, a second precision rectifier, and a second level shifter. The first precision rectifier clamps an input signal at an upper clamping threshold (e.g., at a positive voltage level), through a combination of shifting, inverting, attenuating, and clamping operations, and the first level shifter then shifts and inverts the output signal of the first precision rectifier. The second precision rectifier clamps the input signal at a lower clamping threshold (e.g., at a negative voltage level), through a combination of shifting, inverting, attenuating, and damping operations, and the second level shifter then shifts and inverts the output signal of the second precision rectifier. The use of precision rectifiers in this manner allows the output clamping circuit to maintain substantial linearity of gain and amplitude between the upper and tower clamping thresholds, which tends to reduce noise and improve sensitivity of oscilloscope measurements.

In certain embodiments, the output clamping circuit can be used to improve the performance of high dynamic range oscilloscope probes by clamping the range of output signals in a first channel used for high sensitivity measurements while allowing a large range of output signals to pass through a second channel used for high dynamic range measurements. During typical operation, a user may "zoom-in" on the first channel to view high resolution features, or "zoom-out" on the second channel to view lower resolution features. Because the clamping circuit prevents the first channel from overdriving the oscilloscope, it will improve the "zoomed-in" viewing even if the input voltage to the first channel swings to a high level during the viewing. In certain other embodiments, the output clamping circuit can be applied to a single channel, where it is selectively enabled or disabled according to the types of measurements being performed. For instance, the output clamping circuit can be enabled when observing small signals at high sensitivity, and it can be disabled when observing larger signals at lower sensitivity.

Although several embodiments are described with reference to oscilloscopes and oscilloscope probe, the described concepts are not limited to oscilloscope technologies and can be applied in other contexts, such as other forms of test or measurement instruments. The described clamping circuits, for instance, could be applied in any context where it is desirable to perform clamping with linear gain and amplitude between the clamping thresholds.

FIG. 1 is a schematic diagram of an oscilloscope and oscilloscope probe according to a representative embodiment. This diagram is presented to illustrate an example context in which output clamping may be applied to an oscilloscope probe.

Referring to FIG. 1, a measurement system 100 comprises an oscilloscope probe 105 and an oscilloscope 110. During typical operation of measurement system 100, a user applies a probe tip of oscilloscope probe 105 to a test point of a DUT. Upon making contact with the test point, oscilloscope probe 105 detects a signal at the test point and transmits the signal to oscilloscope 110. Oscilloscope 110 then converts the signal into a waveform to be displayed on a display 115.

Oscilloscope probe 105 can take a variety of alternative forms. For instance, it may be an active probe or a passive probe; it may be a single ended probe or a differential probe. Additionally, although oscilloscope probe 105 is shown as a single lead with a single probe head and tip, it could alternatively be implemented with multiple leads to be connected to a DUT, for instance. Oscilloscope probe 105 typically receives an input signal from the DUT, processes the input signal (e.g., by amplification in an active probe), and then optionally clamps the value of the processed input signal to produce an output signal.

Oscilloscope 110 receives the output signal of oscilloscope probe 105 as an input signal and performs processing on the received input signal. This processing may include, for instance, amplification by an input amplifier and digitization by an ADC. The digitization produces a stream of digital values to be presented on display 115. The input amplifier and/or ADC are typically configured to amplify and/or digitize signals according to a range of values that can be presented on display 115. This range, also referred to as the "full screen range" of display 115, is typically specified by a number of vertical divisions of display 115 and a number of volts per division (V/div). This range can be adjusted by changing the attenuation of oscilloscope probe 105 and/or the input amplifier, for example. In a typical implementation, the full screen range is slightly lower than the dynamic range of the input amplifier and ADC, so these components do not immediately saturate when the input voltage of oscilloscope 110 exceeds the full screen range. For instance, if the dynamic range of the input amplifier and ADC is set to 10V, the full screen range may be set to 8V.

The input amplifier of oscilloscope 110 may be protected by an overdrive protection circuit that is activated when the input signal of oscilloscope 110 exceeds the dynamic range of the input amplifier. The operation of the overdrive protection circuit, however, may introduce distortion into signals that do not exceed the dynamic range of the input amplifier. This distortion is typically present during a period of overdrive recovery following deactivation of the overdrive protection circuit. In general, the distortion may interfere with the observation and measurement of signals of interest. To prevent such interference, oscilloscope probe 105 comprises an output clamping circuit that restricts its output to within the dynamic range of the input amplifier of oscilloscope 110, effectively preventing the overdrive recovery circuit from being activated. Examples of such an output clamping circuit, along with further details of its operation, are described below with reference to other figures.

Figure 2:
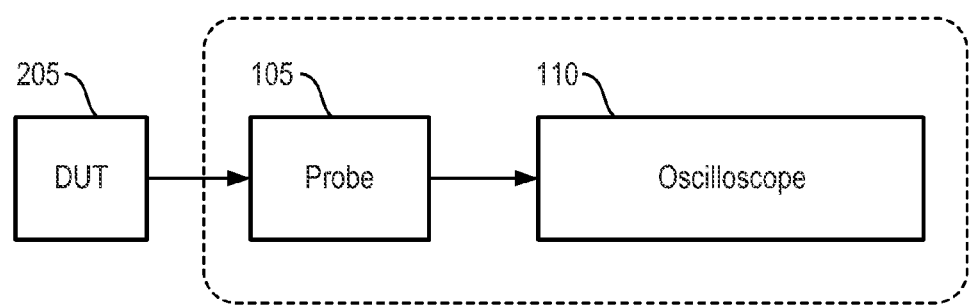
FIG. 2 is a block diagram of the oscilloscope and oscilloscope probe of FIG. 1 according to a representative embodiment.

FIG. 2 is a block diagram of oscilloscope 110 and oscilloscope probe 105 of FIG. 1 according to a representative embodiment. This diagram is presented as a simple illustration of the signal flow from a DUT 205 to oscilloscope 110.

Referring to FIG. 2, where oscilloscope probe 105 is in contact with DUT 205, a signal is transmitted from DUT 205 to oscilloscope probe 105. Within oscilloscope probe 105, the signal is optionally transmitted through a voltage clamping circuit to ensure that it does not exceed predetermined upper and lower clamping threshold voltages. Then, the signal is transmitted to oscilloscope 110 where it is amplified, digitized, and presented on display 115.

Figure 3:
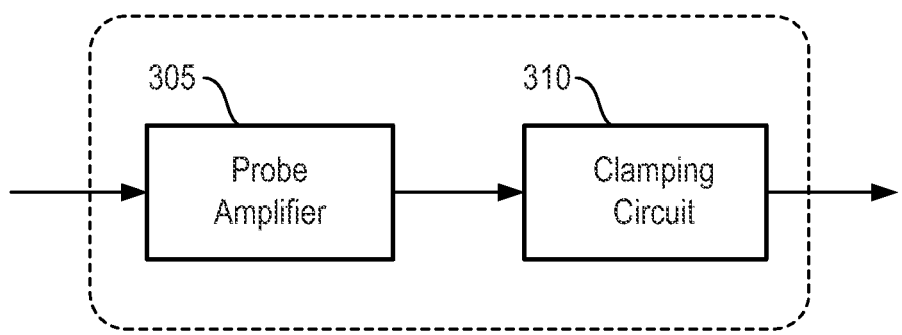
FIG. 3 is a block diagram of the oscilloscope probe of FIG. 2 according to a representative embodiment.

FIG. 3 is a block diagram of oscilloscope probe 105 of FIG. 2 according to a representative embodiment. This diagram is presented as a simple example of some of the possible features of oscilloscope probe 105 and a possible signal flow within oscilloscope probe 105. In this example, oscilloscope probe 105 is an active probe, but it could alternatively be a passive probe.

Referring to FIG. 3, oscilloscope probe 105 comprises a probe amplifier 305 and an clamping circuit 310 for clamping the output of oscilloscope probe 105. Probe amplifier 305 receives an input signal from DUT 205 and amplifies the input signal. Clamping circuit 310 clamps the amplified input signal to produce an output signal whose range does not exceed a lower or upper clamping threshold.

In certain embodiments, probe amplifier 305 is operated with relatively high gain and low bandwidth to provide output signals having a relatively low signal to noise ratio (SNR). Under these conditions, oscilloscope probe 105 can be used to detect and output signals of relatively small magnitude. At the same time, if the amplified input signal becomes relatively large such that it exceeds the upper and/or lower clamping threshold, clamping circuit 310 will prevent oscilloscope probe 105 from outputting the large signal to oscilloscope 110, thus preventing activation of overdrive protection and the introduction of accompanying distortion.

Although not illustrated in FIG. 3, oscilloscope probe 105 may further comprise mechanisms for adjusting various characteristics of probe amplifier 305 and/or clamping circuit 310. For instance, it may comprise mechanisms for lowering the gain of probe amplifier 305 and/or disabling operation of clamping circuit 310 to analyze larger input signals. Additionally, it may comprise mechanisms for adjusting the upper and lower clamping thresholds, e.g., for compatibility with an oscilloscope or process having a different overdrive protection threshold.

Figure 4A:
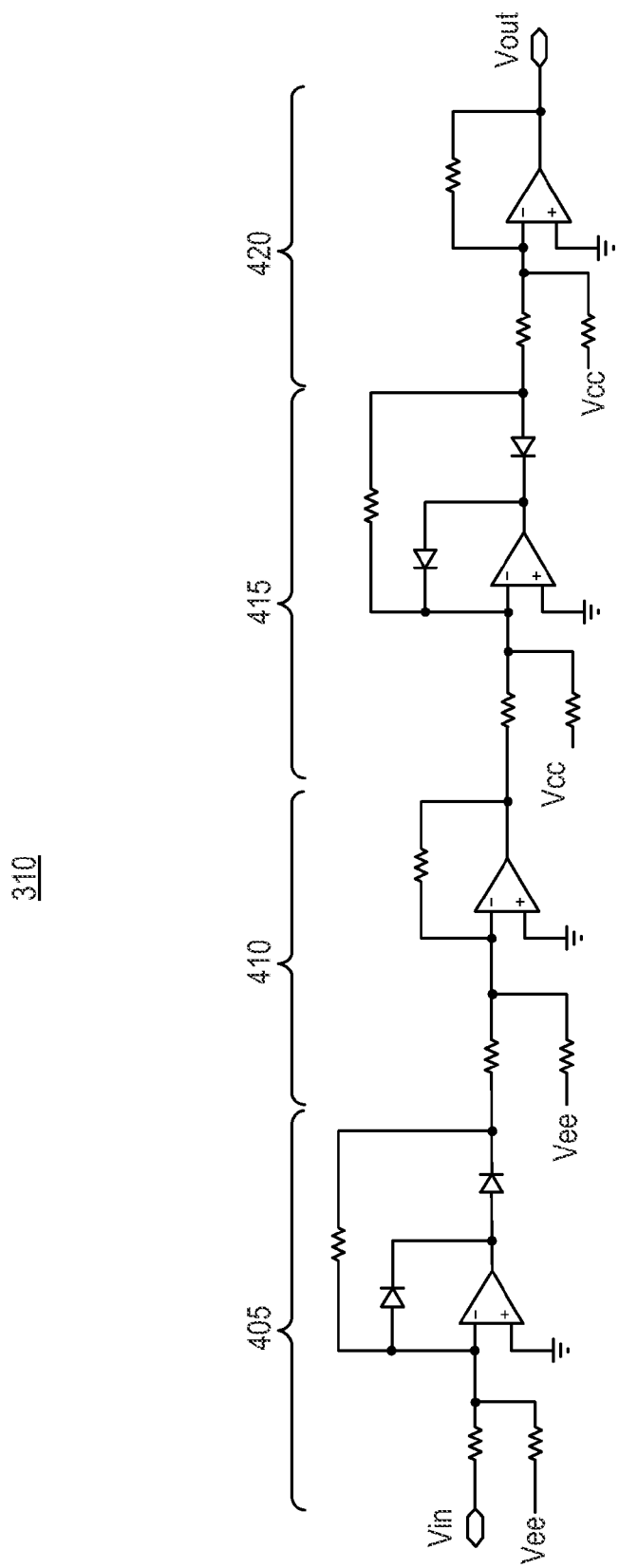
FIG. 4A is a circuit diagram of a clamping circuit in the oscilloscope probe of FIG. 3 according to a representative embodiment.
Figure 4B:
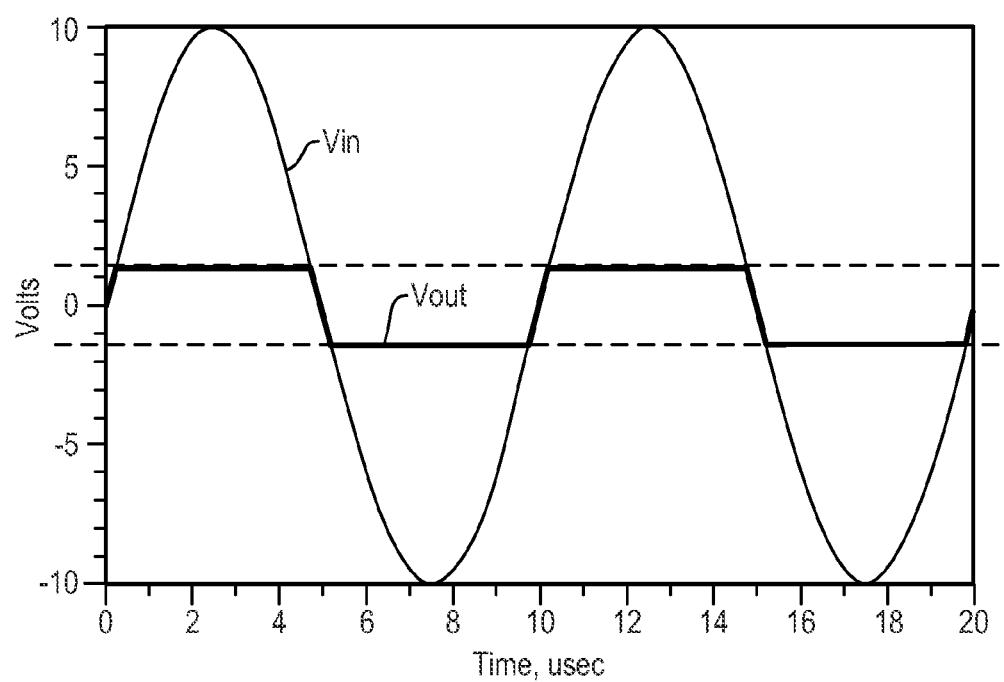
FIG. 4B is a voltage diagram illustrating the operation of the clamping circuit of FIG. 4A according to a representative embodiment.

FIG. 4A is a circuit diagram of clamping circuit 310 in the oscilloscope probe of FIG. 3 according to a representative embodiment, and FIG. 4B is a voltage diagram illustrating the operation of the clamping circuit of FIG. 4A according to a representative embodiment. A general description of clamping circuit 310 will be presented with reference to FIGS. 4A and 4B, and a more detailed description of individual features of clamping circuit 310 will be presented with reference to FIGS. 5 through 8.

In the examples of FIGS. 4A and 4B, clamping circuit 310 comprises a sequence of sub-circuits that are configured, collectively, to clamp an input signal Vin to produce an output signal Vout bounded by upper and tower clamping thresholds. For illustration purposes, input signal Vin is shown as a simple sinusoid in the example of FIG. 4B and subsequent figures. In practice, however, the input signal of clamping circuit could take any arbitrary form. Also for illustration purposes, the upper and lower clamping thresholds are shown by dotted tines at +1.4V and −1.4V, respectively, in the example of FIG. 4B and the subsequent figures. In practice, however, these thresholds could be adjusted arbitrarily.

Referring to FIG. 4A, the sub-circuits of clamping circuit 310 comprise a first precision rectifier 405, a first level shifter 410, a second precision rectifier 415, and a second level shifter 420. These circuits are arranged in sequence as illustrated in FIG. 4A, and are configured, respectively, to clamp a positive portion of input signal Vin, to perform level shifting in coordination with the positive clamping, to clamp a negative portion of input signal Vin, and to perform level shifting in coordination with the negative clamping. First and second precision rectifiers 405 and 415 each behave like an ideal diode and a rectifier. In the illustrated design, however, each of these precision rectifiers has been modified to include an input resistor that produces a direct current (DC) shift on nonzero output voltages. Each of first and second level shifters 410 and 420 has an input resistor that produces a corresponding DC shift. The values of these input resistors can be adjusted, in a coordinated fashion, to determine the upper and lower clamping thresholds.

Referring to FIG. 4B, where input signal Vin is within the upper and lower clamping thresholds, output signal Vout has substantially the same shape as input signal Vin. Otherwise, output signal Vout is clamped at +/−1.4 volts. Because output signal Vout has substantially the same shape as input signal Vin within the thresholds, portions of Vin within the thresholds can be observed with reliability on oscilloscope 110 even if some portions of Vin exceed the thresholds. More generally, clamping circuit 310 can be said to exhibit substantially linearity of its gain and amplitude throughout the region between the upper and lower clamping thresholds. The similarity between input signal Vin and output signal Vout is a consequence of this substantial linearity.

Figure 5A:
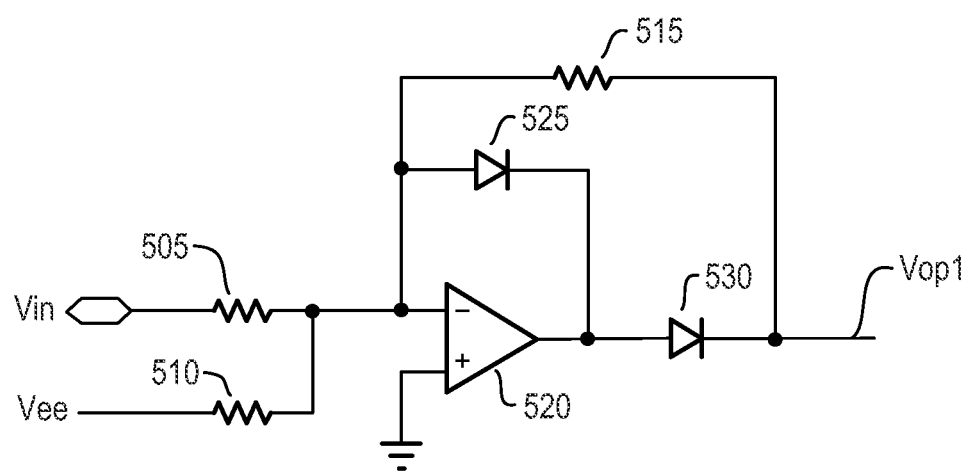
FIG. 5A is a circuit diagram of a first precision rectifier in the clamping circuit of FIG. 4A according to a representative embodiment.
Figure 5B:
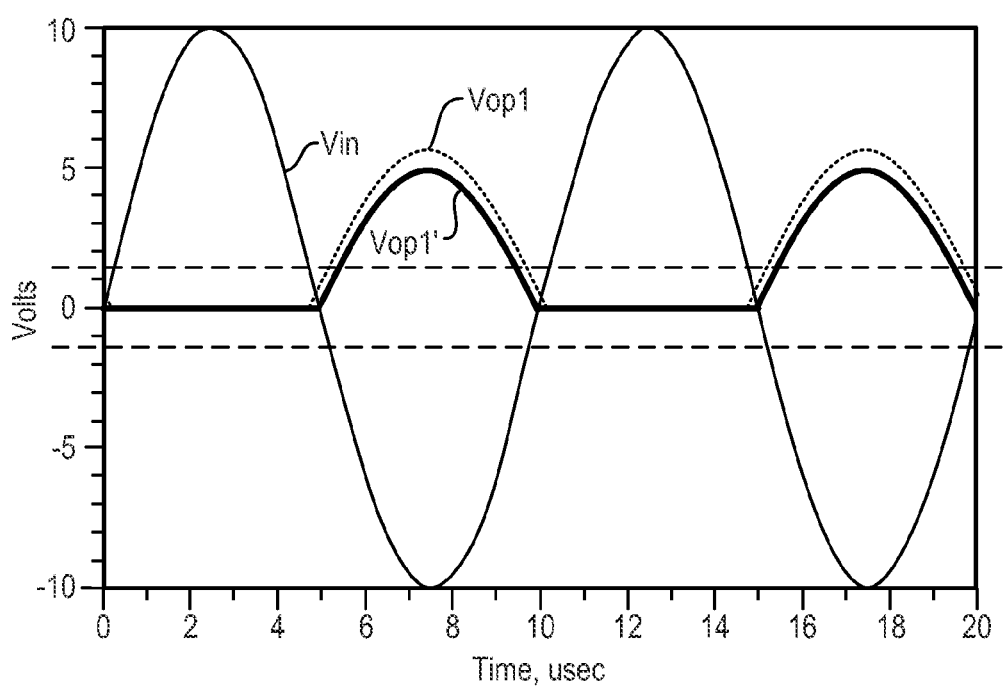
FIG. 5B is a voltage diagram illustrating the operation of the first precision rectifier of FIG. 5A according to a representative embodiment.

FIG. 5A is a circuit diagram of first precision rectifier 405 in clamping circuit 310 of FIG. 4A according to a representative embodiment, and FIG. 5B is a voltage diagram illustrating the operation of first precision rectifier 405 of FIG. 5A according to a representative embodiment.

Referring to FIGS. 5A and 5B, first precision rectifier 405 receives input signal Vin and produces an output signal Vop1. Output signal Vop1 is produced by a combination of shifting, inverting, attenuating, and clamping of input signal Vin. First precision rectifier 405 comprises first, second and third resistors 505, 510 and 515, an operational amplifier (op-amp 520) arranged in an inverting configuration, and first and second diodes 525 and 530. Second resistor 510 is connected to a negative supply voltage Vee, and the remaining features are connected to each other as shown in FIG. 5A.

During typical operation of first precision rectifier 405, input voltage Vin is first modified according to the behavior of an inverting op amp across first resistor 505. The negative supply voltage Vee and second resistor 510 create a DC shift at Vop1. The value of the modified voltage is determined by, among other things, the resistance values of the resistors and the magnitude of negative supply voltage Vee. These and other parameters can be calibrated in combination with other features of clamping circuit 310 to produce the desired operating characteristics. The modified voltage is inverted, clamped, and attenuated by the combination of op-amp 520, third resistor 515, and first and second diodes 525 and 530.

As illustrated in FIG. 5B, the operation of first precision rectifier 405 clamps all negative voltages at zero, which ultimately results in the clamping of positive portions of input voltage Vin. This clamping also relies on the introduction of a DC offset to input voltage Vin. To illustrate the consequence of omitting the DC offset, FIG. 5B shows a modified output voltage Vop1', which has a value of zero volts for all positive values of input voltage Vin.

Figure 6A:
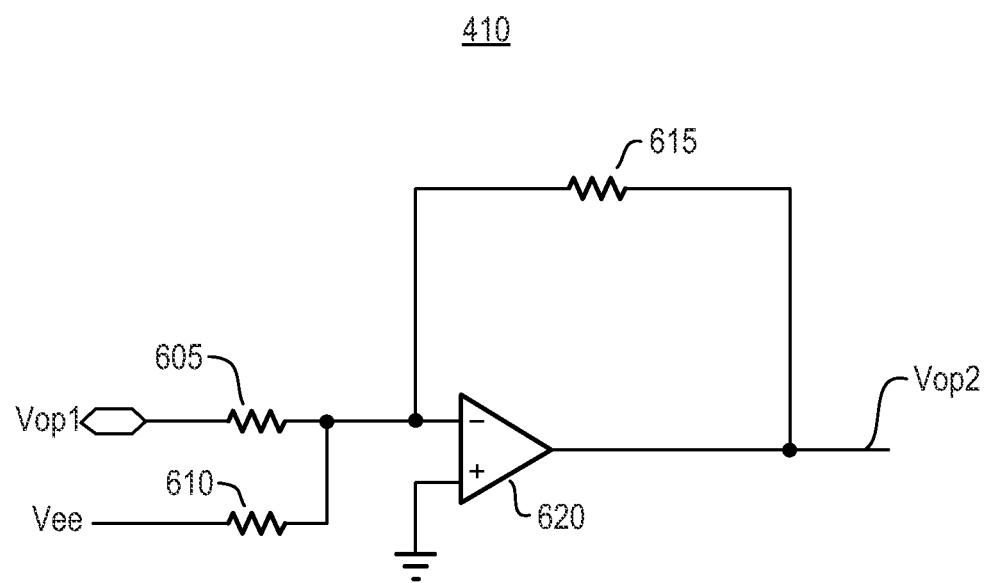
FIG. 6A is a circuit diagram illustrating a first level shifter in the clamping circuit of FIG. 4A according to a representative embodiment.
Figure 6B:
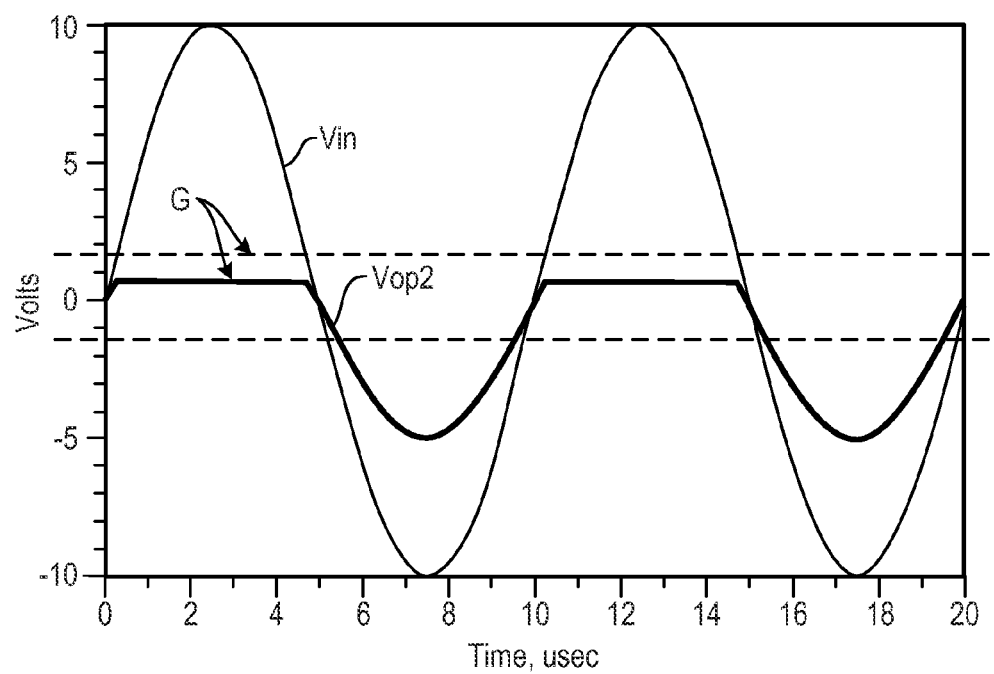
FIG. 6B is a voltage diagram illustrating the operation of the first level shifter of FIG. 6A according to a representative embodiment.

FIG. 6A is a circuit diagram of first level shifter 410 in clamping circuit 310 of FIG. 4A according to a representative embodiment, and FIG. 6B is a voltage diagram illustrating the operation of first level shifter 410 of FIG. 6A according to a representative embodiment.

Referring to FIGS. 6A and 6B, first level shifter 410 receives output signal Vop1 from first precision rectifier 405 and produces an output signal Vop2. Output signal Vop2 is produced by a combination of shifting and inverting of output signal Vop2. First level shifter 410 comprises first, second and third resistors 605, 610 and 615, and an op-amp 620 arranged in an inverting configuration. Second resistor 610 is connected to negative supply voltage Vee, and the remaining features are connected to each other as shown in FIG. 6A.

During typical operation first level shifter 410, output voltage Vop1 is first modified according to the behavior of an inverting op amp across third resistor 605. The negative supply voltage Vee and second resistor 610 create a DC shift at Vop2. The value of the modified voltage is determined by, among other things, the resistance values of the resistors and the magnitude of negative supply voltage Vee. These and other parameters can be calibrated in combination with other features of clamping circuit 310 to produce the desired operating characteristics. The modified voltage is inverted and attenuated by the combination of op-amp 620 and third resistor 615.

As illustrated by FIG. 6B, output signal Vop2 comprises a clamped portion that corresponds to positive values of input signal Vin. As illustrated by a gap "G" between the clamped portion and the dotted lines representing the upper clamping threshold, output signal Vop2 must be subsequently scaled up in order for clamping to occur at the upper clamping threshold. This scaling occurs through operation of second precision rectifier 415 and second level shifter, as illustrated by FIGS. 7 and 8.

Figure 7:
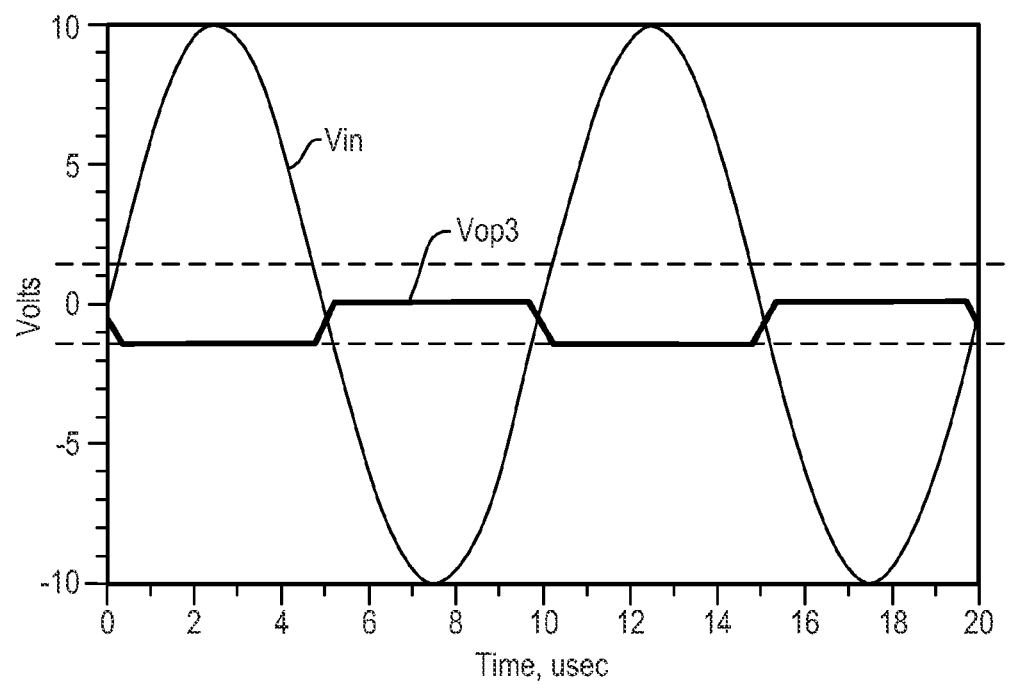
FIG. 7 is a circuit diagram of a second precision rectifier in the clamping circuit of FIG. 4A according to a representative embodiment.

FIG. 7 is a voltage diagram illustrating the operation of second precision rectifier 415 of FIG. 4A according to a representative embodiment. The basic configuration of second precision rectifier 415 is similar to that of first precision rectifier 405 as described in relation to FIG. 5A, except that the direction of the diodes is reversed, the supply voltage creating a DC shift is positive, and the values of the resistors may be modified as needed to achieve a desired attenuation and DC shift. The operation of such a circuit will be well understood by those skilled in the art based on the above description.

As illustrated in FIG. 7, second precision rectifier 415 produces an output signal Vop3 by a combination of shifting, inverting, attenuating, and clamping of output signal Vop2. These operations are similar to those performed by first precision rectifier 405, except that they produce clamping on portions of output signal Vop2 that correspond to negative voltages in input signal Vin.

Figure 8:
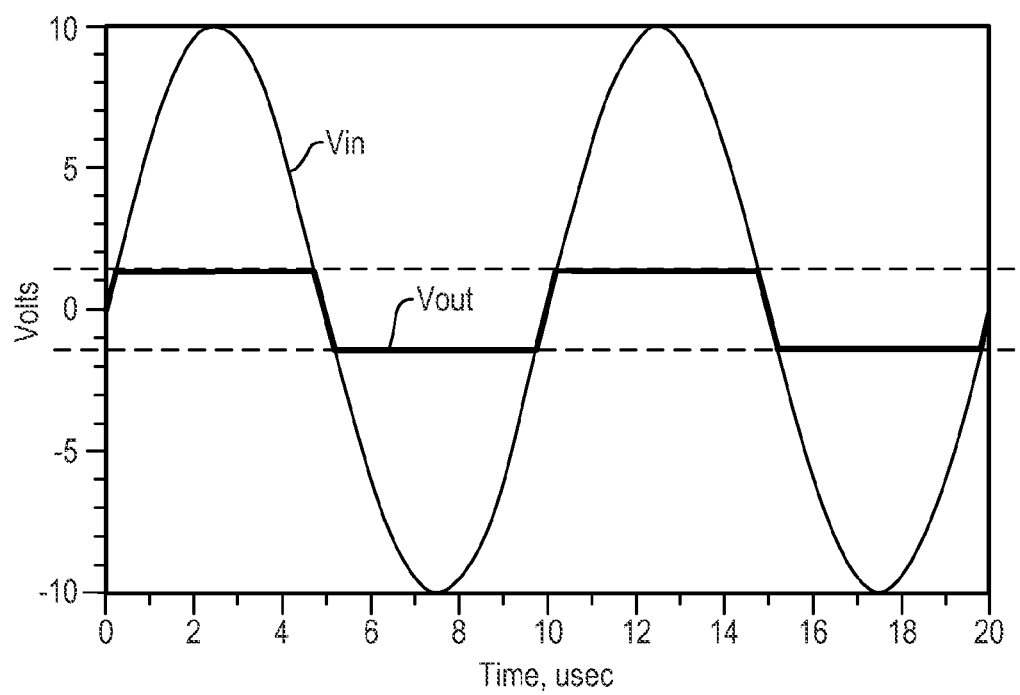
FIG. 8 is a circuit diagram of a second level shifter in the clamping circuit of FIG. 4A according to a representative embodiment.

FIG. 8 is a voltage diagram illustrating the operation of second level shifter 420 of FIG. 4A according to a representative embodiment. The basic configuration of second level shifter 420 is similar to that of first level shifter 410 as described in relation to FIG. 6A, except that the values of the resistors may be modified as needed to achieve a desired DC shift. The operation of such a circuit will be well understood by those skilled in the art based on the above description.

As illustrated in FIG. 8, second level shifter 420 produces output signal Vout by a combination of shifting, scaling, and inverting output signal Vop3. As indicated by the alignment between output voltage Vout and the dotted lines in FIG. 8, the operation of second level shifter 420 scales output signal Vop3 to the level of the upper and lower clamping thresholds.

Figure 9:
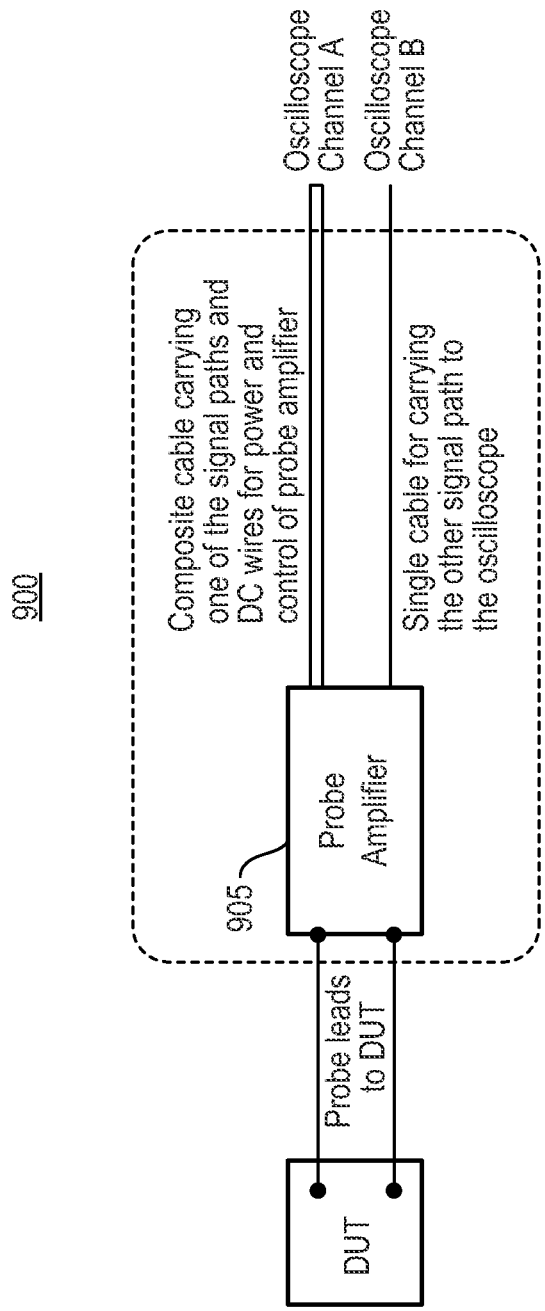
FIG. 9 is a circuit diagram of an oscilloscope probe connected to a device under test according to a representative embodiment.
Figure 10:
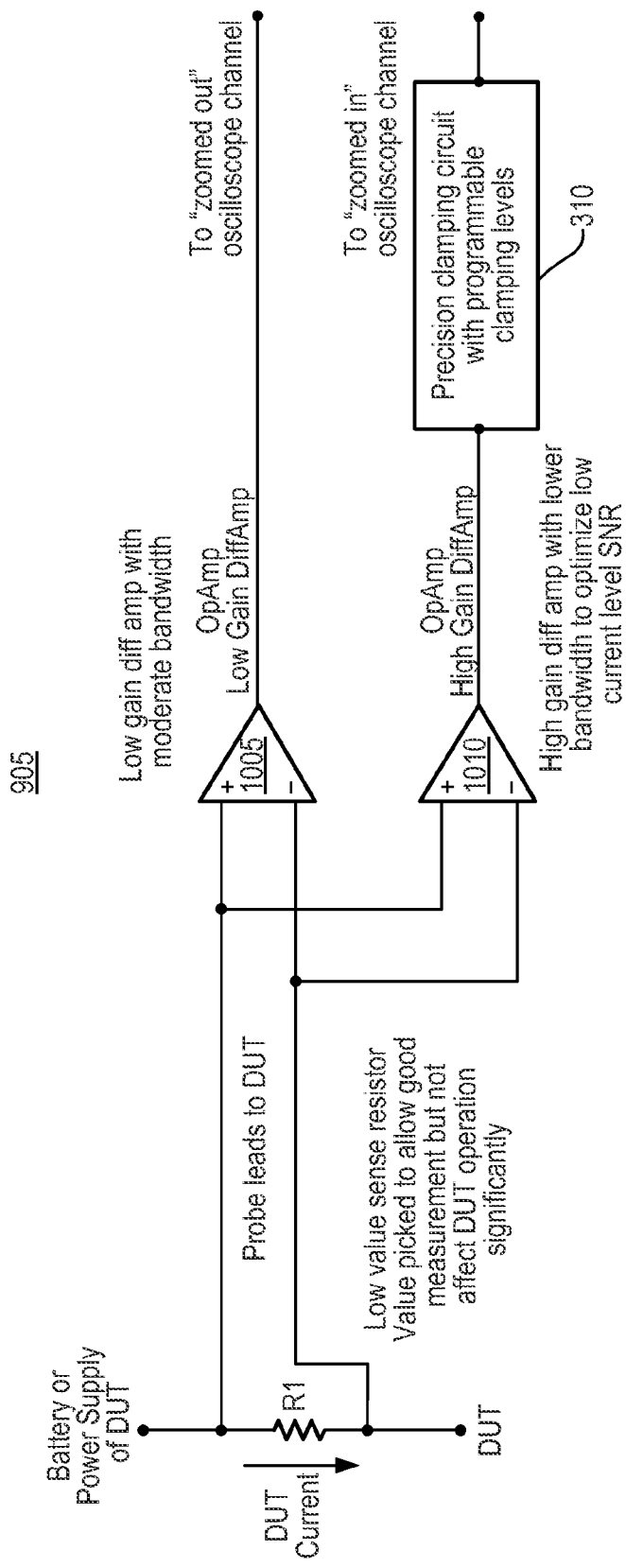
FIG. 10 is a more detailed circuit diagram of the oscilloscope probe of FIG. 9 according to a representative embodiment.

FIG. 9 is a circuit diagram of an oscilloscope probe 900 connected to a device under test according to a representative embodiment, and FIG. 10 is a more detailed circuit diagram of oscilloscope probe 900 according to a representative embodiment. Oscilloscope probe 900 is a high dynamic range oscilloscope probe and represents one of many potential applications of the output clamping circuit described above.

Referring to FIGS. 9 and 10, oscilloscope probe 900 is connected to two oscilloscope channels A and B. Channel A is used for observing an input signal at a broad scale (i.e., a "zoomed out" scale) and channel B is used for observing small portions of the input signal on a magnified scale ("zoomed in" scale). A probe amplifier 905 receives the input signal through a pair of probe leads connected to a DUT, and it transmits the input signal to the respective channels A and B through amplifiers 1005 and 1010. Amplifier 1005 is a tower gain (i.e., a first gain) differential amplifier with moderate bandwidth (i.e., a first bandwidth), and amplifier 1010 is a higher gain (i.e., a second gain) differential amplifier with lower bandwidth (i.e., a second bandwidth) to enhance or optimize low current level SNR. To prevent channel B from being overdriven or saturated by signals output through the higher gain differential amplifier, clamping circuit 310 is placed at the output of this amplifier. Although not shown in the figures, switching circuits can be added at the outputs of the tow and high gain differential amplifiers so the "zoomed out" and "zoomed in" signal paths can be reversed if desired. Additionally, switching circuits can be added so that the clamping circuit can be diverted, thus switching off the clamping behavior.

Oscilloscope probe 900 provides one solution to the problem of viewing and measuring very small currents and fairly high currents with the same current probe so that DUTs can be evaluated over their complete operation from low power "sleep" modes all the way to max power modes, which may be, for instance, transmit modes for wireless devices or high speed data transfers and processing. A potential benefit of this high dynamic range oscilloscope probe compared to conventional probes is that it can avoid measuring current with only one signal path, generally has SNR limitations. For example, it can use the "zoomed out" signal path to measure the larger currents all the way to the maximum current with good SNR for currents in this range, and it can use the "zoomed in" signal path to measure very small currents that exist in a low power or "sleep" mode. Additionally, the use of clamping circuit 310 in the "zoomed in" signal path prevents oscilloscope probe 900 from overdriving the oscilloscope input and causing possible overdrive recovery issues for the oscilloscope. As indicated in FIG. 10, the "zoomed in" signal path has a relatively large gain and a limited bandwidth which greatly improves the SNR for measuring very small currents. This feature may be included in recognition that large bandwidths are typically not needed for these types of measurements, and improving the SNR is more desirable than having excess bandwidth.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A probe for a measurement instrument, comprising:
   an input terminal configured to receive an input signal from a device under test (DUT);
   an output terminal configured to transmit an output signal to a measurement instrument; and
   a clamping circuit comprising: a first precision rectifier configured to clamp a positive voltage portion of the internal probe signal to produce a first intermediate signal;
   a first level shifter configured to adjust a direct current (DC) bias of the first intermediate signal to produce a second intermediate signal; a second precision rectifier configured to clamp a negative voltage portion of the internal probe signal to produce a third intermediate signal; and a second level shifter configured to adjust a DC bias of the third intermediate signal to produce the analog output signal, the clamping circuit being disposed in a signal path between the input terminal and the output terminal and configured to clamp an internal probe signal between an upper clamping threshold and a lower clamping threshold to produce the output signal, the upper clamping threshold corresponding to a positive voltage level and the lower clamping threshold corresponds to a negative voltage level, wherein the clamping circuit operates with substantial gain and amplitude linearity throughout a range between the upper clamping threshold and the lower clamping threshold.

2. The probe of claim 1, wherein the measurement instrument is an oscilloscope.

3. The probe of claim 1, wherein each of the first precision rectifier, the first level shifter, the second precision rectifier, and the second level shifter comprises an operational amplifier arranged in an inverting configuration.

4. The probe of claim 1, wherein the first precision rectifier performs clamping on the positive voltage portion by adjusting a DC bias of the internal probe signal, inverting the internal probe signal, and clamping a negative voltage portion of the adjusted and inverted internal probe signal.

5. The probe of claim 1, further comprising:
   an additional output terminal configured to transmit an additional output signal to the measurement instrument;
   a first probe amplifier disposed in the signal path between the input terminal and the output terminal and located between the input terminal and the clamping circuit; and
   a second probe amplifier disposed in an additional signal path between the input terminal and the additional output terminal.

6. The probe of claim 5, wherein the first probe amplifier has a first gain and a first bandwidth, and the second probe amplifier has a second gain lower than the first gain and a second bandwidth higher than the first bandwidth.

7. The probe of claim 5, wherein the first and second probe amplifiers are configured to amplify a voltage corresponding to a current through the DUT.

8. A measurement system, comprising:
   a measurement instrument comprising an overdrive protection circuit having respective upper and lower overdrive protection thresholds; and a measurement probe comprising an input terminal configured to receive an input signal from a device under test (DUT), an output terminal configured to transmit an output signal to the measurement instrument, and a clamping circuit comprising: a first precision rectifier configured to clamp a positive voltage portion of the internal probe signal to produce a first intermediate signal; a first level shifter configured to adjust a direct current (DC) bias of the first intermediate signal to produce a second intermediate signal; a second precision rectifier configured to clamp a negative voltage portion of the internal probe signal to produce a third intermediate signal; and a second level shifter configured to adjust a DC bias of the third intermediate signal to produce the analog output signal, the clamping circuit being disposed in a signal path between the input terminal and the output terminal and configured to clamp an internal probe signal between an upper clamping threshold and a lower clamping threshold to produce the output signal, the upper clamping threshold corresponding to a positive voltage level and the lower clamping threshold corresponds to a negative voltage level, wherein the upper overdrive protection threshold is greater than or equal to the upper clamping threshold and the lower overdrive protection threshold is less than or equal to the lower clamping threshold.

9. The measurement system of claim 8, wherein the clamping circuit operates with substantial gain and amplitude linearity throughout a range between the upper clamping threshold and the lower clamping threshold.

10. The measurement system of claim 8, wherein the measurement instrument is an oscilloscope and the measurement probe is an oscilloscope probe.

11. The measurement system of claim 8, wherein the measurement instrument comprises first and second channels configured to receive respective first and second input signals from the measurement probe, wherein the first channel receives an input signal through the signal path, and the second channel receives an input signal through an additional signal path of the measurement probe.

12. The measurement system of claim 11, wherein the measurement probe further comprises a first probe amplifier disposed in the signal path and located between the input terminal and the clamping circuit, and a second probe amplifier disposed in the additional signal path between the input terminal and the additional output terminal.

13. The measurement system of claim 8, wherein the overdrive protection circuit is configured to prevent overdriving of an input amplifier of the measurement instrument.

14. The measurement system of claim 12, wherein the first probe amplifier has a first gain and a first bandwidth, and the second probe amplifier has a second gain lower than the first gain and a second bandwidth higher than the first bandwidth.

15. The measurement system of claim 8, wherein the first precision rectifier performs clamping on the positive voltage portion by adjusting a DC bias of the internal probe signal, inverting the internal probe signal, and clamping a negative voltage portion of the adjusted and inverted internal probe signal.

16. The measurement system of claim 8, wherein each of the first precision rectifier, the first level shifter, the second precision rectifier, and the second level shifter comprises an operational amplifier arranged in an inverting configuration.

17. The measurement system of claim 8, further comprising:
an additional output terminal configured to transmit an additional output signal to the measurement instrument;
a first probe amplifier disposed in the signal path between the input terminal and the output terminal and located between the input terminal and the clamping circuit; and
a second probe amplifier disposed in an additional signal path between the input terminal and the additional output terminal.

18. A method of operating a measurement probe, comprising:
receiving an input signal from a device under test (DUT);
processing the input signal to produce an output signal; and
transmitting the output signal to a measurement instrument,
wherein processing the input signal comprises clamping the input signal between an upper clamping threshold and a lower clamping threshold to produce the output signal by operating a clamping circuit having substantial gain and amplitude linearity throughout a range between the upper clamping threshold and the lower clamping threshold, the clamping comprising: inverting the input signal and shifting a direct current (DC) bias of the input signal; clamping a negative portion of the inverted and shifted input signal to produce a first intermediate signal; inverting the first intermediate signal and shifting a DC bias of the inverted first intermediate signal to produce a second intermediate signal; inverting the second intermediate signal and shifting a DC bias of the second intermediate signal; clamping a positive portion of the inverted and shifted second intermediate signal to produce a third intermediate signal; and inverting the third intermediate signal and shifting a DC bias of the inverted third intermediate signal.

19. The method of claim 18, wherein processing the input signal to produce the output signal further comprises transmitting the input signal through a first channel comprising the clamping circuit and further comprising a first probe amplifier configured to amplify the input signal, and the method further comprises transmitting the input signal through a second channel comprising a second probe amplifier having lower gain and higher bandwidth than the first probe amplifier.

20. The method of claim 18, further comprising selectively disabling the clamping of the input signal.

* * * * *